Jan. 22, 1963
A. L. FISHER ETAL
3,075,157
AUTOMATIC REST FREQUENCY CONTROL FOR PULSED
FREQUENCY MODULATED OSCILLATOR
Filed Feb. 29, 1960
2 Sheets-Sheet 1

INVENTOR.
ARCHIE L. FISHER
EUGENE S. McVEY
BY Gust & Irish
ATTORNEYS

INVENTOR.
ARCHIE L. FISHER
EUGENE S. Mc VEY
BY *Gust & Irish*
ATTORNEYS

United States Patent Office 3,075,157

Patented Jan. 22, 1963

3,075,157

AUTOMATIC REST FREQUENCY CONTROL FOR PULSED FREQUENCY MODULATED OSCILLATOR

Archie L. Fisher, Fort Wayne, and Eugene S. McVey, Lafayette, Ind., assignors to International Telephone and Telegraph Corporation Filed Feb. 29, 1960, Ser. No. 11,754
3 Claims. (Cl. 332—14)

This invention generally relates to pulsed frequency modulated oscillators, i.e., an oscillator which is pulse modulated between a first or "rest" frequency and a second frequency, and more particularly to a system for automatically controlling the rest frequency of a pulsed frequency modulated oscillator during the intervals when the oscillator is not being pulse-modulated.

The basic or rest frequency of a frequency modulated oscillator may vary over a considerably wide range due to such factors as tube aging, component instability, temperature variations, and power supply voltage fluctuations. It is highly desirable that the rest frequency of a pulsed frequency modulated oscillator be accurately controlled within narrow limits. In the past, efforts were made to control or stabilize the rest frequency by enclosing the basic circuitry of the oscillator in a temperature controlled oven. However, it was frequently found that component instability with temperature cycling in the oven caused the oscillator rest frequency to vary beyond the requisite limits and furthermore, the heat dissipated by the tubes limited the ambient temperature range of the oven-enclosed unit. In addition, an appreciable warm-up period was required in order to stabilize the oven temperature. It is therefore desirable to provide an automatic rest frequency control system for a pulsed frequency modulated oscillator which will provide high frequency stability with standard power supplies and which eliminates the need for enclosing the basic circuitry in an oven. While systems have been proposed for automatic frequency control of frequency modulated oscillators, to the best of the present applicants' knowledge, such prior systems have still not provided the requisite degree of frequency stability.

It is therefore an object of our invention to provide an improved automatic rest frequency control system for a pulsed frequency modulated oscillator.

Our invention in its broader aspects provides frequency modulated oscillator means including means for changing the output frequency thereof responsive to an input pulse and means for controlling the rest frequency responsive to a control signal. First and second stable reference oscillator means are provided respectively having fixed output frequencies equally above and below the rest frequency of the frequency modulated oscillator means. First and second mixing means are provided each coupled to a respective reference oscillator means and to the frequency modulated oscillator means for respectively providing first and second difference frequency signals. First and second frequency-sensitive amplifier means are coupled respectively to the mixing means for respectively providing output signals responsive to the amplitude and frequency of the difference frequency signals. First and second voltage discriminator means are respectively coupled to the amplifier means for respectively providing direct current output voltages of opposite sign having an amplitude responsive to the output signal of the respective frequency-sensitive amplifier means. Voltage combining means is provided coupled to the discriminator means for combining the voltages provided thereby to provide a control signal having a sign and amplitude responsive to the direction and amount of the deviation of the rest frequency from the midpoint between the output frequencies of the reference oscillator means. The voltage combining means is coupled to the frequency varying means of the frequency modulated oscillator means thereby controlling the rest frequency responsive to the control signal.

The above mentioned and other features and objects of this invention and the manner of attaining them will become more apparent and the invention itself will be best understood by reference to the following description of an embodiment of the invention taken in conjunction with the accompanying drawings, wherein:

FIG. 3 is a diagram showing the response characteristic of the two channels in accordance with FIG. 2.

Figure 1:
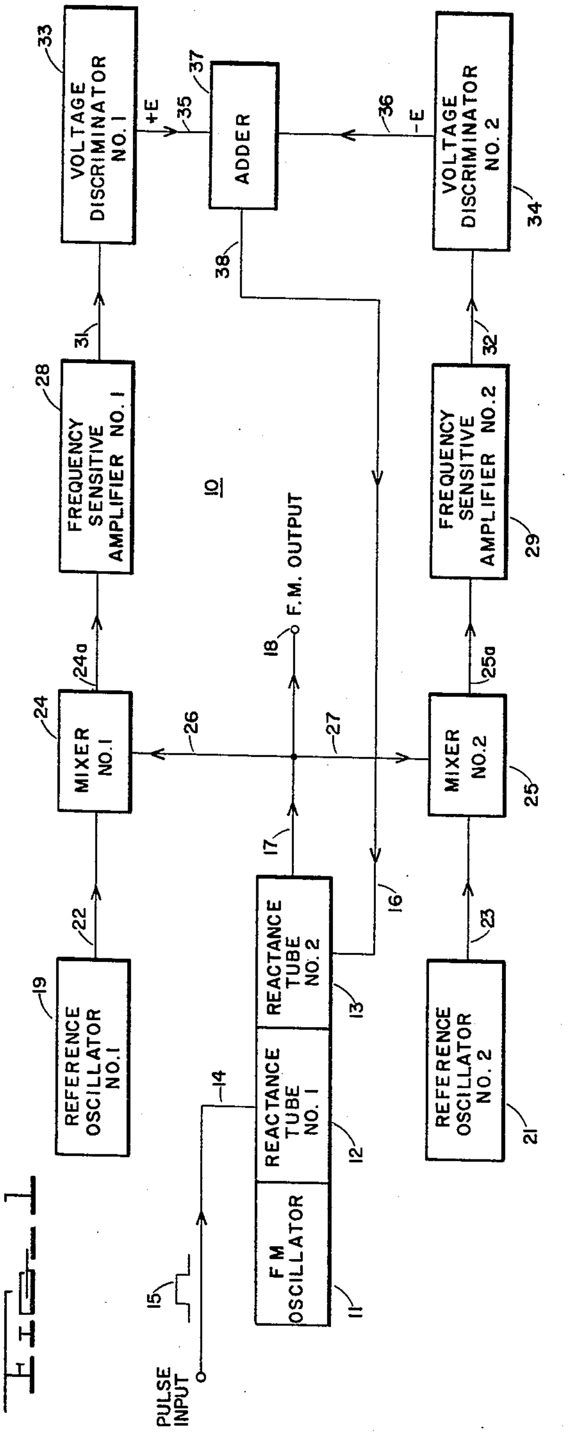
FIG. 1 is a block diagram illustrating the system of our invention.

Referring now to FIG. 1, our improved automatic rest frequency control system, generally identified at 10, comprises a frequency modulated oscillator 11 including a tank circuit with two reactance tubes 12 and 13 coupled therein for varying the resonant frequency of the tank circuit, as is well known to those skilled in the art; reactance tubes 12 and 13 may be pentodes, respectively, having their plate and screen grids coupled across the oscillator tank circuit, as is well known in the art.

Reactance tube 12 has input circuit 14 for connection to the source of modulating pulses 15 while reactance tube 13 has an input circuit 16 for receiving a control signal as will hereinafter be more fully described. Reactance tube 12 is employed for pulse modulating frequency modulated oscillator 11 from its rest frequency to a second frequency during the duration of the input pulse 15 which may, for example, be up to two seconds before the controlling circuit attempts to compensate for the change in frequency. Reactance tube 13 is employed for controlling the rest frequency of frequency modulated oscillator 11, as will hereinafter be more fully described. An output circuit 17 is coupled to the tank circuit of frequency modulated oscillator 11 and frequency modulated output signal terminal 18 is connected thereto as shown.

In order to provide for automatic control of the rest frequency of oscillator 11 during the intervals between the modulating pulses 15, two reference oscillators 19 and 21 are provided. Reference oscillators 19 and 21 provide a fixed output frequency, and thus preferably are of the crystal controlled variety. Reference oscillators 19 and 21 provide output frequencies respectively equally above and below the rest frequency of frequency modulated oscillator 11 and thus, in the illustrative example, reference oscillator 19 may have a frequency of 25.210 kc. and reference oscillator 21 may have a frequency of 25.250 kc. Reference oscillators 19 and 21 respectively have their output circuits 22 and 23 coupled to signal mixers 24 and 25; mixers 24 and 25 are also coupled to receive the frequency modulated output signal from frequency modulated oscillator 11 by connections 26 and 27 to output circuit 17, as shown. Signal mixers 24 and 25 provide in their output circuits 24*a* and 25*a* a difference frequency signal, i.e., a signal having a frequency which is the difference between the frequency of the respective reference oscillator and the rest frequency of the frequency modulated oscillator 11. Signal mixers 24 and 25 are coupled to frequency sensitive amplifiers 28 and 29; frequency sensitive amplifiers 28 and 29 have a gain which is responsive to the frequency of the input signal, i.e., as the frequency of the input signal increases the gain of the amplifier increases.

Frequency sensitive amplifiers 28 and 29 have their output circuits 31 and 32 respectively coupled to voltage discriminators 33 and 34. Voltage discriminators 33 and 34 include half-wave rectifiers for rectifying the sine wave signal in the output circuits 31 and 32 of frequency sensitive amplifiers 28 and 29, the rectifiers being oppositely polarized to provide direct current output voltages of opposite sign which are respectively responsive to the frequency and amplitudes of the output signals from the amplifiers 28 and 29. Voltage discriminators 33 and 34 also include time delay circuitry having a time delay longer than the duration of the input pulses 15 so that there will be no variation in the direct current output voltages from the discriminators 33 and 34 during the period when an input pulse 15 is applied to reactance tube 12.

The direct current voltages of opposite sign in the output circuits 35 and 36 from discriminators 33 and 34 are applied to an adding circuit 37 which in turn has its output circuit 38 connected to input circuit 16 of reactance tube 13, as shown.

Reactance tube 13 is normally biased to a predetermined quiescent state in the absence of a control signal. It will be seen that the amplitude of the direct current output signals from the discriminators 33 and 34 are dependent upon the frequency difference between the rest frequency of the frequency modulator oscillator 11 and the output frequencies of the reference oscillators 19 and 21, and thus, when the rest frequency of the frequency modulated oscillator 11 is midway between the frequencies of the reference oscillators 19 and 21, the resultant voltage from the adding network 37 will be zero and the control reactance tube 13 will be in its quiescent state. Thus, with the rest frequency of frequency modulated oscillator 11 at exactly 25.230 kc., the difference frequencies provided by mixers 24 and 25 will each be twenty cycles per second. Thus, the output signals from amplifiers 28 and 29 will have equal amplitudes and the output voltages from discriminators 33 and 34 will have equal amplitudes of opposite sign so that the output signal from the adding circuit 37 will be zero.

Assuming now that the rest frequency of the frequency modulated oscillator 11 is low, for example, 25.220 kc., it will be seen that the difference frequency between reference oscillator 19 and the rest frequency has decreased, i.e., from twenty cycles to ten cycles, whereas the difference frequency between reference oscillator 21 and frequency modulated oscillator 11 has increased, i.e., from twenty cycles to thirty cycles. Thus, the amplitude of the output signal from amplifier 28 will decrease producing a corresponding decrease in the amplitude of the direct current voltage in the output of discriminator 33, whereas the amplitude of the output signal from the amplifier 29 has increased in turn providing a corresponding increase in the amplitude of the direct current voltage in the output of discriminator 34. The two voltages applied to the adding network 37 are thus no longer equal and with the output voltage from discriminator 34 being of negative sign, the resultant voltage in the output 38 of adding circuit 37 will be of negative value and when applied to the reactance tube 13 will cause the rest frequency of the frequency modulated oscillator 11 to increase. As the rest frequency increases, the difference frequency between reference oscillator 19 and frequency modulated oscillator 11 will increase on the one hand, while the difference frequency between reference oscillator 21 and frequency modulated oscillator 11 will decrease on the other hand until a balanced point of operation is obtained, with the rest frequency midway between the frequencies of the reference oscillators 19 and 21. By virtue of the time constant circuits incorporated in the discriminators 33 and 34, a sufficient time delay is provided in the operation of the discriminators 33 and 34 to allow the frequency modulated oscillator 11 to be pulse modulated by input pulses 15 for the requisite period without sacrificing stability or losing control. It will be readily observed that the direct current voltages provided by the discriminators 33 and 34 are both amplitude and frequency sensitive to any change in the respective difference frequency. This fact enables our improved system to respond to minute changes in rest frequency, and to correct for deviations of less than one cycle at the rest frequency.

Figure 2:
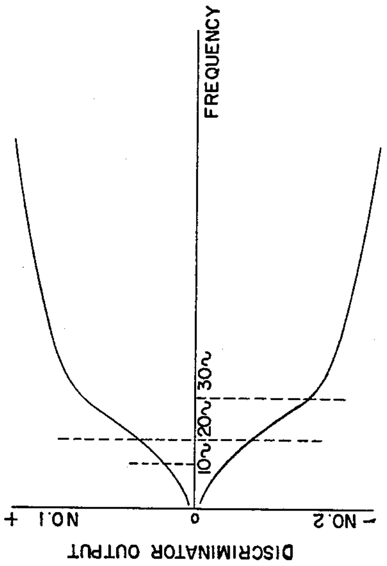
FIG. 2 is a schematic diagram showing the preferred embodiment of one mixer-frequency sensitive amplifier voltage discriminator channel of our invention.
Figure 2:
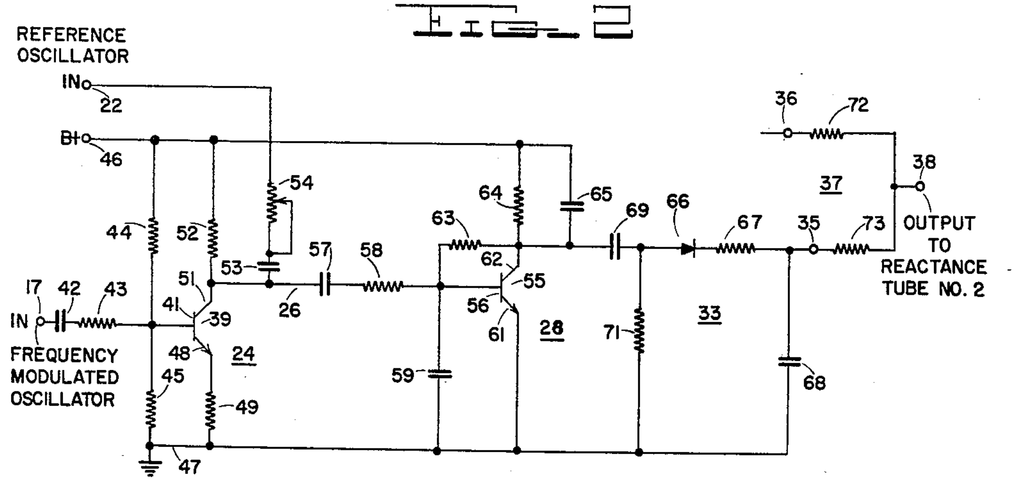

Referring now to FIG. 2 in which like elements are indicated by like reference numerals, there is shown the preferred embodiment of one of the mixer-frequency sensitive amplifier-voltage discriminator channels of our invention. Here, mixer 24 comprises a transistor 39 having its base 41 coupled to output circuit 17 of the frequency modulated oscillator 11 by coupling capacitor 42 and series resistance 43. Base bias for transistor 39 is provided by a voltage divider comprising resistors 44 and 45 connected between a source of positive potential 46 and base 41 on the one hand, and between base 41 and ground 47 on the other hand. Emitter 48 of transistor 39 is connected to ground by resistor 49 while collector 51 is connected to a positive source 46 by resistor 52. Collector 51 is also coupled to the output circuit 22 of reference oscillator 19 by capacitor 53 and serially connected potentiometer 54. Potentiometer 54 is employed for varying the amplitude of the reference oscillator output frequency, and thus is used to selectively determine the level of the signal applied to frequency sensitive amplifier 28.

The frequency sensitive amplifier 28 comprises transistor 55 having its base 56 coupled to collector 51 of mixer transistor 39 by coupling capacitor 57 and series resistor 58. Base 56 is connected to ground 47 by capacitor 59 and emitter 61 is directly connected to ground as shown. Base 56 of transistor 55 is connected to collector 62 by resistor 63 and collector 62 is connected to positive source 46 by resistor 64 having capacitor 65 in parallel therewith.

Discriminator 33 comprises a diode 66 and a time constant circuit comprising resistor 67 serially connected with diode 66 and a capacitor 68. Diode 66 and resistor 67 are serially connected with collector 62 of amplifier transistor 55 by capacitor 69. The midpoint between capacitor 69 and diode 66 is connected to ground by resistor 71. It will be readily understood that the diodes 66 in the voltage discriminators 33 and 34 will be oppositely polarized.

Adding circuit 37 merely comprises resistors 72 and 73 respectively connecting output circuits 35 and 36 of discriminators 33 and 34 to output circuit 38, as shown.

It will be readily seen that resistor 58 and capacitor 59 of amplifier 28 cooperate to form a low pass filter, and that capacitors 65 and 69 also contribute some of the frequency sensitivity to provide a characteristic as shown in FIG. 3. Thus, the filter provided by resistance 58 and capacitor 59 pass the difference frequency contained in the output signal from the mixer 24 while suppressing the fundamental and the sum frequency.

Referring to FIG. 3 in which the difference frequency impressed upon amplifiers 28 and 29 is plotted against the direct current output voltages provided by discriminators 33 and 34, it will be seen that at a difference frequency of twenty cycles in each channel, the resulting output voltages of discriminators 33 and 34 are equal but of opposite sign. It will further be seen that with the difference frequency impressed on amplifier 28 being ten cycles and the difference frequency impressed upon amplifier 29 being thirty cycles, as described above, the resulting output voltage of discriminator 36 will be substantially greater than the output voltage of discriminator 33 so that the output from the adder 37 will be a voltage of negative sign which is the difference between the output voltages of discriminator 34 and discriminator 33.

Figure 4:
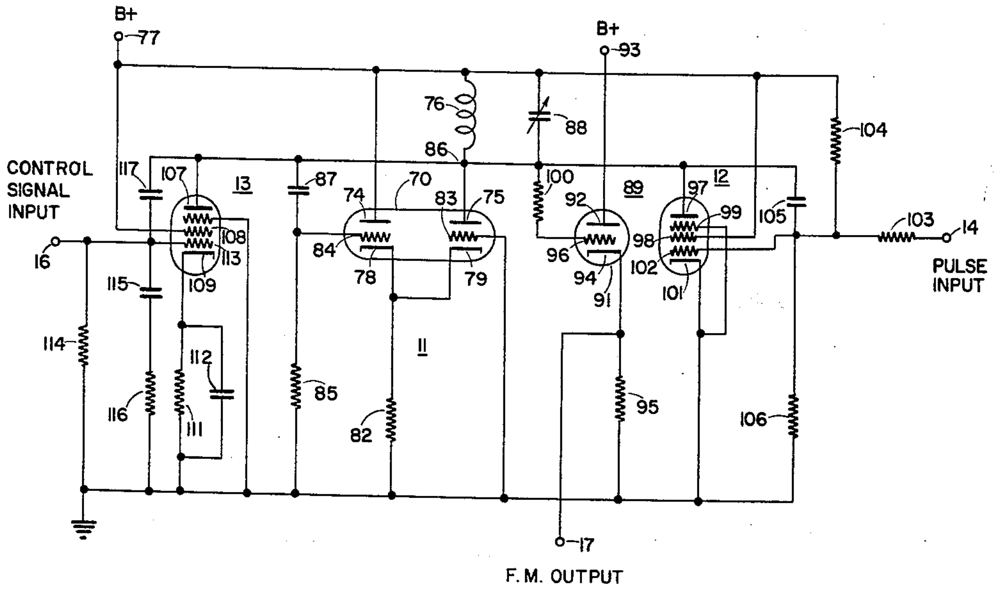
FIG. 4 is a schematic diagram showing the preferred embodiment of the frequency modulated oscillator of our invention.

Referring to FIG. 4, there is shown the preferred embodiment of frequency modulated oscillator 11 and reactance tubes 12 and 13. Here, oscilaltor 11 is shown as comprising a twin triode 70 having its two plates 74 and 75 connected to opposite ends of the tank inductance 76, plate 74 also being connected to a suitable source 77 of positive plate potential. Cathodes 78 and 79 are connected together as shown and to ground 81 by cathode resistor 82. Control grid 83 is directly connected to ground while control grid 84 is connetced to ground by resistor 85 and to end 86 of tank coil 76 by capacitor 87. Variable capacitor 88 is connected across tank coil 76 as shown. Oscillator 11 will thus be recognized as being of the push-pull type.

The output from oscillator 11 is provided by a cathode follower 89 comprising a triode 91 having its plate 92 connected to a suitable source 93 of positive plate potential and having its cathode 94 connected to ground by resistor 95; output circuit 17 from the frequency modulated oscillator 11 is taken from cathode 94 as shown. Control grid 96 is connected to end 86 of tank coil 76 by resistor 100 as shown; resistor 90 provides isolation and reduces the effect of the cathode follower on the oscillator frequency.

Reactance tube 12 has its plate 97 connected to end 86 of tank coil 76 and has its screen grid 98 connected to the other side of tank coil 76, as shown. Suppressor grid 99 of reactance tube 12 is connected to cathode 101 and to ground 81 as shown. Control grid 102 is connected to the pulse input circuit 14 by resistor 103 and also to the source 77 of positive plate potential by resistor 104. Control grid 102 is also connected to the end 86 of tank coil 76 by capacitor 105 and to ground by resistor 106.

Reactance tube 13 has its plate 107 connected to end 86 of tank coil 76 and its screen grid 108 connected to the source 77 of positive plate potential and the other side of tank coil 76 as shown. Cathode 109 of reactance tube 13 is connected to ground by resistor 111 having capacitor 112 in parallel therewith. Control grid 113 is connected to the control signal input circuit 16 and to ground by resistor 114. Control grid 113 is also connected to ground by capacitor 115 and serially connected resistor 116 and to plate 107 by capacitor 117. It will be seen that resistors 111 and 114 cooperate to provide a bias for control grid 113 of reactance tube 13 to provide a predetermined quiescent plate current level so that application of the control signal to the input circuit 16 will thus vary the plate current flow either up or down depending upon the sign and amplitude of the control signal, in turn varying the screen grid-plate capacitance which, it will be observed, is in parallel with the tank coil 76, thus in turn varying the output frequency in the output circuit 17.

In an actual system incorporating the circuit configurations of FIGS. 2 and 4, the following component values were used:

| | | |
|---|---|---|
| Reactance tubes **12** and **13** | | 6AU6 |
| Transistor **39** | | 2N333 |
| Capacitor **42** | microfarads | .01 |
| Resistor **43** | ohms | 1,000 |
| Resistor **44** | do | 200,000 |
| Resistor **45** | do | 20,000 |
| Source **46** | volts | 18 |
| Resistor **49** | ohms | 2,000 |
| Resistor **52** | do | 20,000 |
| Capacitor **53** | microfarads | .1 |
| Potentiometer **54** | ohms | 100,000 |
| Transistor **55** | | 2N335 |
| Capacitor **57** | microfarads | .1 |
| Resistor **58** | ohms | 10,000 |
| Capacitor **59** | microfarads | .068 |
| Resistor **63** | ohms | 360,000 |
| Resistor **64** | do | 20,000 |
| Capacitor **65** | microfarads | .1 |

| | | |
|---|---|---|
| Diode **66** | | 1N538 |
| Resistor **67** | megohms | 1 |
| Capacitor **68** | microfarads | 13 |
| Capacitor **69** | do | .1 |
| Tube **70** | | 5814A |
| Resistor **71** | ohms | 200,000 |
| Resistors **72** and **73** | megohms | 2 |
| Source **77** | volts | +150 |
| Resistor **82** | ohms | 820 |
| Resistor **85** | megohms | 1 |
| Capacitor **87** | microfarads | .022 |
| Tube **89** | | 5814A |
| Resistor **90** | megohms | 1 |
| Source **93** | volts | +250 |
| Resistor **95** | ohms | 56,000 |
| Resistor **103** | do | 100,000 |
| Resistor **104** | do | 520,000 |
| Capacitor **105** | micro-microfarads | 68 |
| Resistor **106** | ohms | 2,700 |
| Resistor **111** | do | 430 |
| Capacitor **112** | microfarads | 10 |
| Resistor **114** | megohms | 2 |
| Capacitor **115** | microfarads | .01 |
| Resistor **116** | homs | 3,000 |
| Capacitor **117** | micro-microfarads | 240 |

We have found that with the circuitry shown in FIGS. 2 and 4 above and with the frequencies referred to hereinabove, absolute control of the frequency modulated oscillator rest frequency is maintained up to ±180 cycles per second semi-permanent shift in the oscillator rest frequency caused by recycling, changing component characteristics, voltage variation, etc. We have further found that the system consistently returns the oscillator to the assigned rest frequency within ±one cycle per second. Furthermore, our system is completely operational with a maximum warm-up time of five minutes compared with sixty minutes in the case of oven controlled systems. Furthermore, the control range (±180 cycles per second) of the oscillator rest frequency can be readily increased with some sacrifice to rest frequency stability.

While we have described above the principles of our invention in connection with specific apparatus, it is to be clearly understood that this description is made only by way of example and not as a limitation to the scope of our invention.

What is claimed is:

1. A system for automatic rest frequency control of a pulsed frequency modulated oscillator comprising: frequency modulated oscillator means including means for changing the output frequency thereof responsive to an input pulse and for controlling the rest frequency responsive to a control signal; first and second stable reference oscillator means respectively having fixed output frequencies equally above and below the rest frequency of said frequency modulated oscillator means; first and second mixing means each coupled to a respective reference oscillator means and to said frequency modulated oscillator means for respectively providing first and second difference frequency signals; first and second frequency-sensitive amplifier means coupled respectively to said mixing means for respectively providing output signals responsive to the amplitude and frequency of said difference frequency signals; first and second voltage discriminator means respectively coupled to said amplifier means for respectively providing direct current output voltages of opposite sign having an amplitude responsive to the output signal of the respective frequency-sensitive amplifier means; and voltage combining means coupled to said discriminator means for combining the voltages provided thereby, said voltage combining means being coupled to said frequency varying means for controlling the rest frequency of said frequency modulated oscillator means responsive to the direction and amount of deviation of the rest frequency from the midpoint between the output frequencies of said reference oscillators, each of said discriminator means including time constant means having a predetermined time constant longer than the duration of said input pulse whereby the discriminator means output voltages do not vary and the frequency of said frequency modulated oscillator means is not controlled during an input pulse.

2. A system for automatic rest frequency control of a pulsed frequency modulated oscillator comprising: frequency modulated oscillator means including means for changing the output frequency thereof responsive to an input pulse and for controlling the rest frequency responsive to a control signal; first and second stable reference oscillator means respectively having fixed output frequencies equally above and below the rest frequency of said frequency modulated oscillator means; first and second mixing means each coupled to a respective reference oscillator means and to said frequency modulated oscillator means for respectively providing first and second difference frequency signals; first and second frequency sensitive amplifier means coupled respectively to said mixing means for respectively providing output signals responsive to the amplitude and frequency of said difference frequency signals; first and second voltage discriminator means respectively coupled to said amplifier means for respectively providing direct current output voltages of opposite sign having an amplitude responsive to the output signal of the respective frequency-sensitive amplifier means; and voltage combining means coupled to said discriminator means for combining the voltages provided thereby, said voltage combining means being coupled to said frequency varying means for controlling the rest frequency of said frequency modulated oscillator means responsive to the direction and amount of deviation of the rest frequency from the midpoint between the output frequencies of said reference oscillators, each of said discriminator means comprising a half-wave rectifier coupled in series with the respective amplifier means and a time constant circuit coupled across said rectifier and having a predetermined time constant longer than the duration of said input pulse whereby the discriminator means output voltages do not vary and the frequency of said frequency modulated oscillator means is not controlled during an input pulse, the said half-wave rectifier means of said discriminator means being oppositely polarized.

3. A system for automatic rest frequency control of a pulsed frequency modulated oscillator comprising: a frequency modulated oscillator having a tank circuit including first and second reactance tubes for respectively varying the output frequency thereof; a pulse input circuit coupled to the first reactance tube whereby the output frequency is changed responsive to an input pulse; means coupled to the second reactance tube for normally biasing the same to a predetermined quiescent state; a control signal input circuit coupled to said second reactance tube for varying the rest frequency responsive to the sign and amplitude of a direct current control signal; a frequency modulated signal output circuit coupled to said tank circuit; first and second stable reference frequency oscillators each having an output circuit and providing fixed frequencies respectively equally above and below the rest frequency of said frequency modulated oscillator; first and second signal mixers each having a first signal input circuit coupled to a respective reference frequency oscillator output circuit, a second signal input circuit coupled to said frequency modulated signal output circuit, and a signal output circuit; first and second frequency-sensitive amplifiers each having an input circuit coupled to the output circuit of a respective mixer and having an output circuit, said amplifiers respectively including tuned circuit means tuned to pass the difference frequency signal in the output signal from the respective mixer, each of said amplifiers having a gain which increases responsive to increase in the frequency of the respective difference frequency signal; first and second voltage discriminators each having an input circuit coupled to the respective amplifier output circuit and having an output circuit, each of said discriminators including a diode and a resistance coupled in series between its input and output circuits and a capacitor connected across its output circuit, said diodes being oppositely polarized whereby said discriminators provide direct current output voltages of opposite sign and having amplitudes respectively proportional to the output signals of said amplifiers, said resistances and capacitors respectively forming time constant circuits with a time constant longer than the duration of said input pulse whereby the output voltages of said discriminators do not vary during said input pulse; and an adding circuit having first and second signal input circuits respectively coupled to said discriminator output circuits and having an output circuit coupled to said control signal input circuit for supplying a control signal thereto having a sign and amplitude responsive to the deviation of said rest frequency from the midpoint between said fixed frequencies.

References Cited in the file of this patent

UNITED STATES PATENTS

| | | |
|---|---|---|
| 2,278,690 | Clarke | Apr. 7, 1942 |
| 2,610,297 | Leed | Sept. 9, 1952 |
| 2,770,727 | Hupert et al. | Nov. 13, 1956 |
| 2,858,422 | Reyburn et al. | Oct. 28, 1958 |